US007192849B2

(12) United States Patent  
Fareed et al.

(10) Patent No.: US 7,192,849 B2
(45) Date of Patent: Mar. 20, 2007

(54) METHODS OF GROWING NITRIDE-BASED FILM USING VARYING PULSES

(75) Inventors: Qhalid Fareed, Columbia, SC (US); Remigijus Gaska, Columbia, SC (US); Michael Shur, Latham, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 173 days.

(21) Appl. No.: 10/713,326

(22) Filed: Nov. 14, 2003

(65) Prior Publication Data

US 2004/0224484 A1   Nov. 11, 2004

Related U.S. Application Data

(60) Provisional application No. 60/468,516, filed on May 7, 2003.

(51) Int. Cl.
*H01L 21/00* (2006.01)

(52) U.S. Cl. .................. 438/478; 438/483; 438/46

(58) Field of Classification Search ............... 438/478, 438/483, 46
See application file for complete search history.

(56) References Cited

U.S. PATENT DOCUMENTS

| | | | | |
|---|---|---|---|---|
| 5,851,905 | A * | 12/1998 | McIntosh et al. | 438/492 |
| 6,673,701 | B1 * | 1/2004 | Marsh et al. | 438/493 |
| 6,933,225 | B2 * | 8/2005 | Werkhoven et al. | 438/627 |
| 2003/0032281 | A1 * | 2/2003 | Werkhoven et al. | 438/640 |
| 2004/0121620 | A1 * | 6/2004 | Pomarede et al. | 438/785 |
| 2004/0126954 | A1 * | 7/2004 | Marsh et al. | 438/200 |
| 2004/0224484 | A1 * | 11/2004 | Fareed et al. | 438/478 |
| 2005/0032342 | A1 * | 2/2005 | Forbes et al. | 438/587 |
| 2005/0106893 | A1 * | 5/2005 | Wilk | 438/758 |
| 2005/0158977 | A1 * | 7/2005 | Yeo et al. | 438/608 |
| 2005/0179097 | A1 * | 8/2005 | Forbes et al. | 257/407 |
| 2005/0181555 | A1 * | 8/2005 | Haukka et al. | 438/232 |

OTHER PUBLICATIONS

"Molecular Beam Epitaxy of Nitride Thin Films," M. J. Paisley et al., Journal of Crystal Growth, vol. 127, Feb. 2, 1993, pp. 136-142.
"Elastic Strain Relaxation and Piezoeffect in GaN-AlN, GaN-AlGaN and GaN-InGaN Superlattices," A. D. Bykhovski et al., Journal of Applied Physics, vol. 81, No. 9, May 1, 1997, pp. 6332-6338.
Pulsed Atomic Layer Epitaxy of Quaternary AlInGaN Layers for Ultraviolet Light Emitters, J. P. Zhang et al., Physica Status Solidi(a), vol. 188, No. 1, 2001, pp. 95-99.
"High Optical Quality AlInGaN by Metalorganic Chemical Vapor Deposition," M. E. Aumer et al., Applied Physics Letters, vol. 75, No. 21, Nov. 22, 1999, pp. 3315-3317.

(Continued)

*Primary Examiner*—Laura M. Schillinger
(74) *Attorney, Agent, or Firm*—Hoffman, Warnick & D'Alessandro LLC

(57) ABSTRACT

Nitride-based film is grown using multiple precursor fluxes. Each precursor flux is pulsed one or more times to add a desired element to the nitride-based film at a desired time. The quantity, duration, timing, and/or shape of the pulses is customized for each element to assist in generating a high quality nitride-based film.

9 Claims, 6 Drawing Sheets

OTHER PUBLICATIONS

"Low Temperature Growth of Gallium Nitride," H. Gotob et al., Japanese Journal of Applied Physics, vol. 20, No. 7, Jul. 1981, pp. L545-L548.

"Energy Band/Lattice Mismatch Engineering in Quaternary AlInGaN/GaN Heterostructure," M. A. Khan et al., Physica Status Solidi(a), vol. 176, No. 1, 1999, pp. 227-230.

"Strain Energy Bank Engineering Approach to AlN/GaN/InN Heterojunction Devices," A. Khan et al., Frontiers in Electronics: Future Chips Proceedings of the 2002 Workshop on Frontiers in Electronics (WOFE-02) St. Croix, Virgin Islands, World Scientific Publishing Co. (Jan. 15, 2003), pp. 195-214 (1-19).

* cited by examiner

METHODS OF GROWING NITRIDE-BASED FILM USING VARYING PULSES

REFERENCE TO PRIOR APPLICATION

The current application claims priority to co-pending provisional application Ser. No. 60/468,516, filed on May 7, 2003 and hereby incorporated herein by reference.

BACKGROUND OF THE INVENTION

1. Technical Field

The invention relates generally to epitaxial growth of semiconductor materials, and more specifically to methods for growing nitride-based film using varying pulses.

2. Related Art

Typically, nitride-based films (e.g., heterostructures) are grown using either Metal Organic Chemical Vapor Deposition (MOCVD), Molecular Beam Epitaxy (MBE), or Reactive Molecular-Beam Epitaxy (RMBE). MOCVD requires a relatively high growth temperature that makes it difficult to grow nitride-based films that include Indium (In) and/or Aluminum (Al). While MBE and RMBE allow growth at lower substrate temperatures, they are difficult to adopt for growing high quality insulating nitride films.

Current optoelectronic nitride devices require about twenty-eight percent Al to operate at wavelengths of approximately three hundred nanometers. For example, an optoelectronic nitride device can include an AlGaN (Aluminum-Gallium-Nitrogen) layer grown over a GaN buffer layer. Due to the lattice mismatch between the two layers, current deposition techniques cannot create a reliable AlGaN layer having a thickness greater than approximately one hundred fifty Angstroms. As a result, currently attainable thicknesses are insufficient for fabricating various semiconductor devices, such as a photodetector or a multiple quantum well light-emitting diode that operates at wavelengths of approximately three hundred nanometers.

Including In in one or both of the AlGaN and GaN layers has been shown to provide greater control over lattice mismatch and strain in the structure. The greater control allows for the creation of devices that are more reliable. A Pulsed Atomic Layer Epitaxy (PALE) technique was developed to deposit AlInGaN layers. PALE layer growth uses a series of metal organic precursor flux pulses to deposit the desired elements.

FIG. 1 shows an illustrative sequence of precursor flux pulses that generate an AlInGaN layer using the PALE technique. The sequence includes several series of pulses 10, 12, 14, 16. Series of pulses 10 applies Al using a precursor flux comprising Tri Methyl Aluminum (TMA), series of pulses 12 applies N using a precursor flux comprising $NH_3$, series of pulses 14 applies In using a precursor flux comprising Tri Methyl Indium (TMI), and series of pulses 16 applies Ga using a precursor flux comprising Tri Methyl Gallium (TMG). Each series of pulses 10, 12, 14, 16 includes at least one pulse. In the sequence, only one precursor flux is pulsed at any given time 18. Each precursor flux flows at a constant rate during a pulse, and does not flow when not pulsed. As a result, each pulse is shown having a rectangular shape. The duration of each pulse was set at approximately six seconds. In the sequence, series of pulses 12 is pulsed every other time, with one of the metalorganic precursor fluxes 10, 14, 16 pulsing between each nitrogen precursor flux pulse.

While the PALE technique allows for the deposition of high quality epitaxial layers at temperatures close to those used by MBE and RMBE, it provides a relatively slow growth rate and does not incorporate any flexibility to allow for optimizing growth of the nitride-based films.

As a result, a need exists for improved methods of growing a nitride-based film that are more efficient and more flexible to produce higher quality, larger nitride-based films.

SUMMARY OF THE INVENTION

The invention provides improved methods of growing a nitride-based film using varying precursor flux pulses. In particular, the quantity, timing, duration, and/or shape of each precursor flux pulse is altered based on the corresponding element to provide a higher quality nitride-based film. As a result, additional control over the growth of the nitride-based film is obtained.

A first aspect of the invention provides a method of growing a nitride-based film, the method comprising: applying a first precursor flux for a first element using a first pulse, wherein the first pulse has a first duration and wherein the first element comprises nitrogen; and applying a second precursor flux for a second element using a second pulse, wherein the second pulse has a second duration, and wherein the second duration is not equal to the first duration.

A second aspect of the invention provides a method of growing a nitride-based film, the method comprising: applying a first precursor flux for a first element using a first series of pulses, wherein the first element comprises nitrogen; and applying a second precursor flux for a second element using a second series of pulses, wherein at least a portion of a pulse in the second series of pulses is applied during at least a portion of a pulse in the first series of pulses.

A third aspect of the invention provides a method of growing a nitride-based film, the method comprising: applying a nitrogen precursor flux comprising $NH_3$ using a first series of pulses; and applying a second precursor flux for a second element using a second series of pulses, wherein a pulse in the second series of pulses has a non-rectangular waveform.

The illustrative aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

It is understood, that for purposes of this description Al means Aluminum, Ga means Gallium, N means Nitrogen, In means Indium, Si means Silicon, Mg means Magnesium, Mn means Manganese, C means Carbon, and H means Hydrogen.

As discussed above, the invention provides improved methods of growing a nitride-based film using varying precursor flux pulses. In particular, the quantity, timing, duration, and/or shape of each precursor flux pulse is altered based on the corresponding element to provide a higher quality nitride-based film. As a result, additional control over the growth of the nitride-based film is obtained.

Figure 1:
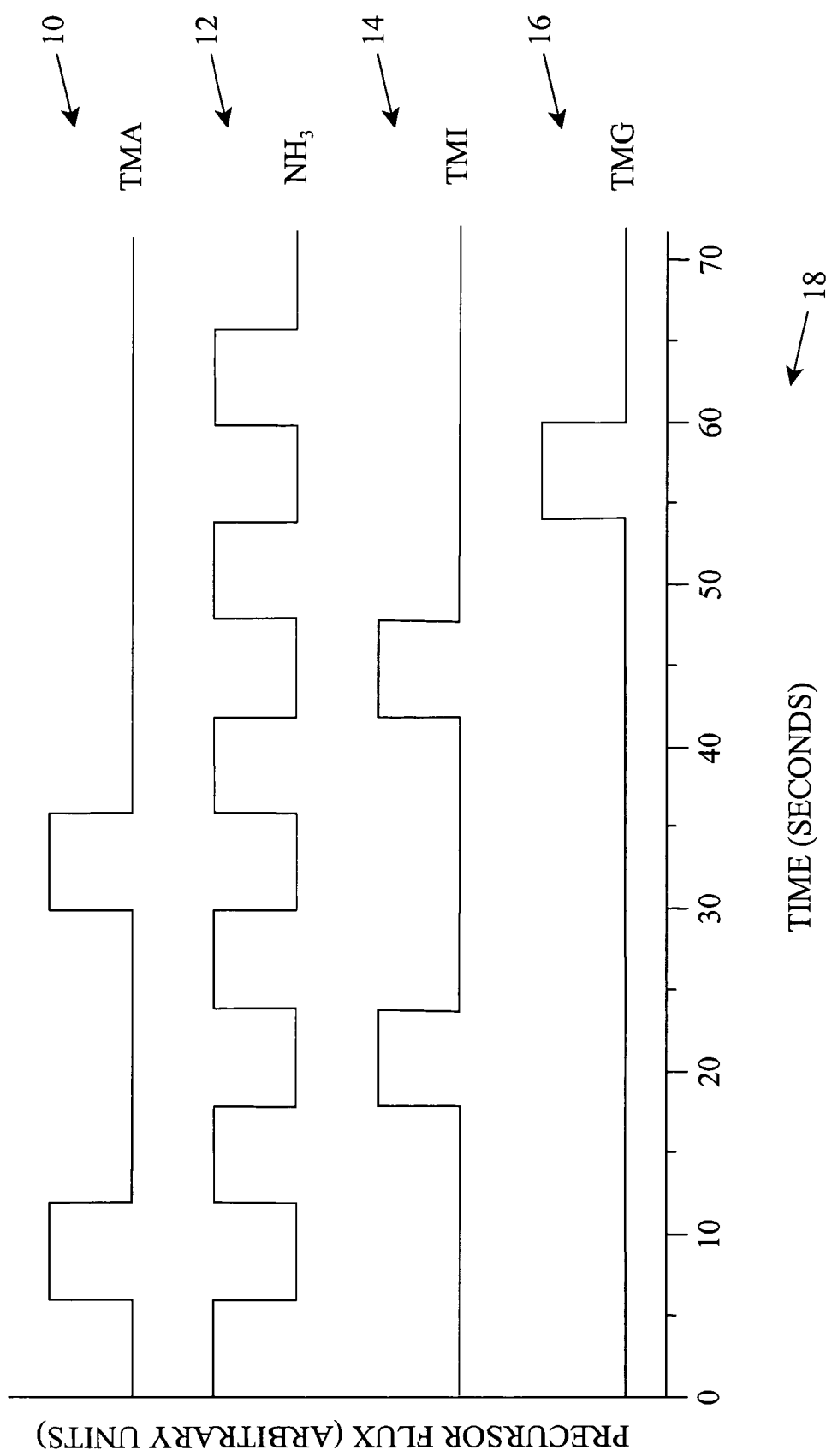
FIG. 1 is an illustrative sequence of flux pulses used in the prior art PALE technique.
Figure 2:
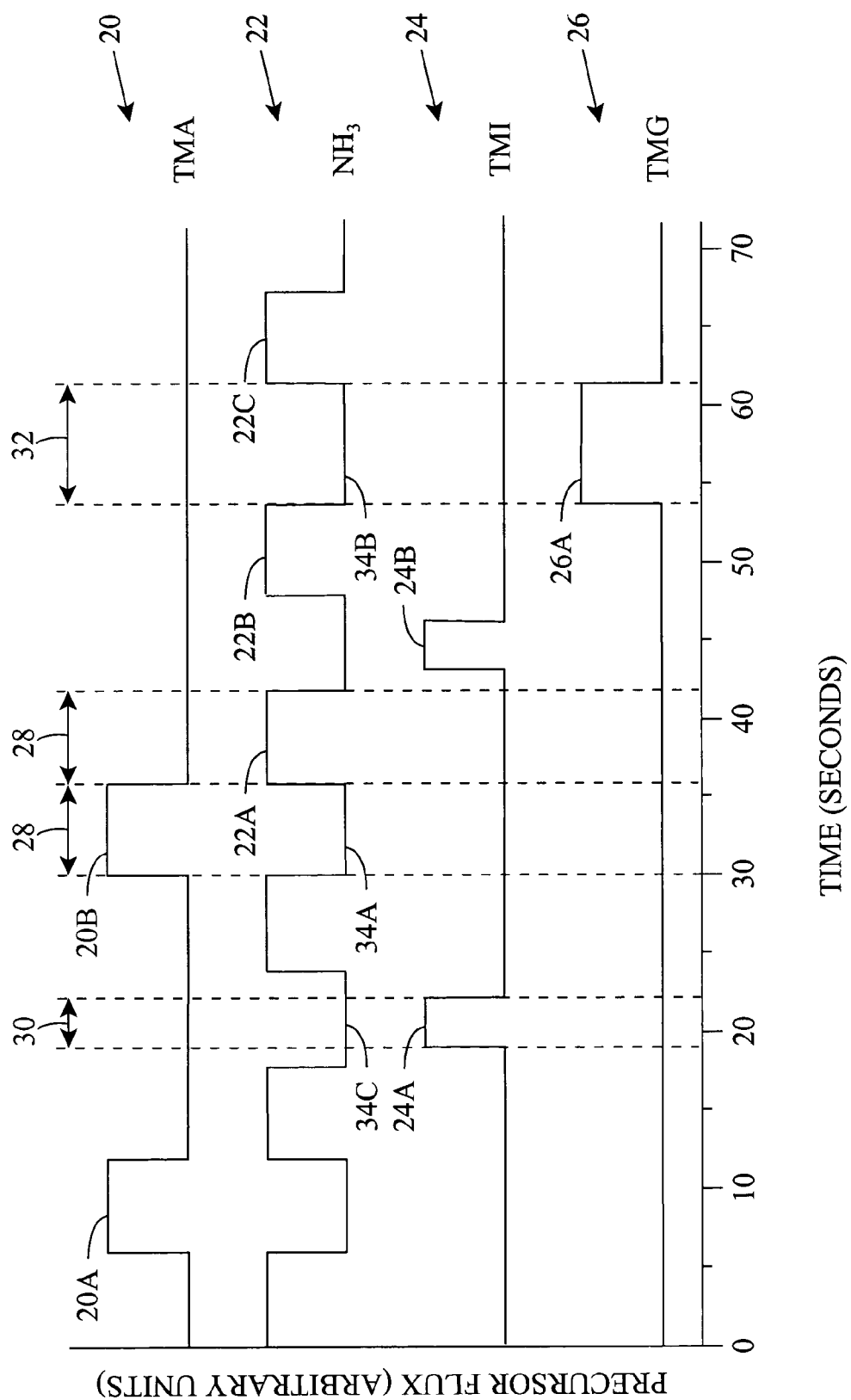
FIG. 2 is an illustrative sequence of flux pulses according to one embodiment of the invention.

Turning to the Figures, FIG. 2 shows several series of pulses in which each series of pulses 20, 22, 24, 26 is used to apply a unique precursor flux onto a nitride-based film that is being grown. Series of pulses 20 applies an Al precursor flux comprising TMA, series of pulses 22 applies a N precursor flux comprising $NH_3$, series of pulses 24 applies an In precursor flux comprising TMI, and series of pulses 26 applies a Ga precursor flux comprising TMG. Each series of pulses 20, 22, 24, 26 includes one or more pulses. In this embodiment, the nitrogen precursor flux series of pulses 22 is pulsed every other time over the sequence, and no two pulses occur at the same time. The duration of pulses is adjusted based on the precursor flux being pulsed to allow for improved surface migration of the precursor flux at the growth surface. This is achieved because different species have different surface migration rates that are accommodated by the invention. For example, series of pulses 22 includes multiple pulses 22A–C that have the same duration 28. Series of pulses 20 comprises two pulses 20A, 20B that also have the same duration 28. However, series of pulses 24 includes two pulses 24A, 24B that have a duration 30 that is less than duration 28, and series of pulses 26 includes a single pulse 26A that has a duration 32 that is greater than duration 28.

Series of pulses 22 also includes gaps 34A–C between consecutive pulses 22A–C. Gap 34A has the same duration 28 as the pulses 22A–C. The duration 28 of gaps 34A–C can be maintained at constant duration 28, or altered based on the duration of an intermediate pulse being applied for one of the other series of pulses 20, 24, 26. For example, gap 34B has a duration 32 that is the same as the duration for pulse 26A. As a result, the gap 34B between the pulses 22B–C that respectively occur immediately before and after pulse 26A has a longer duration 32 than other gaps 34A, 34C in the series of pulses 22. However, gap 34C has a duration that is longer than duration 30 for pulse 24A. The duration of gap 34C could be the same as duration 28 for gap 34A and/or other gaps in series of pulses 22.

Figure 3:
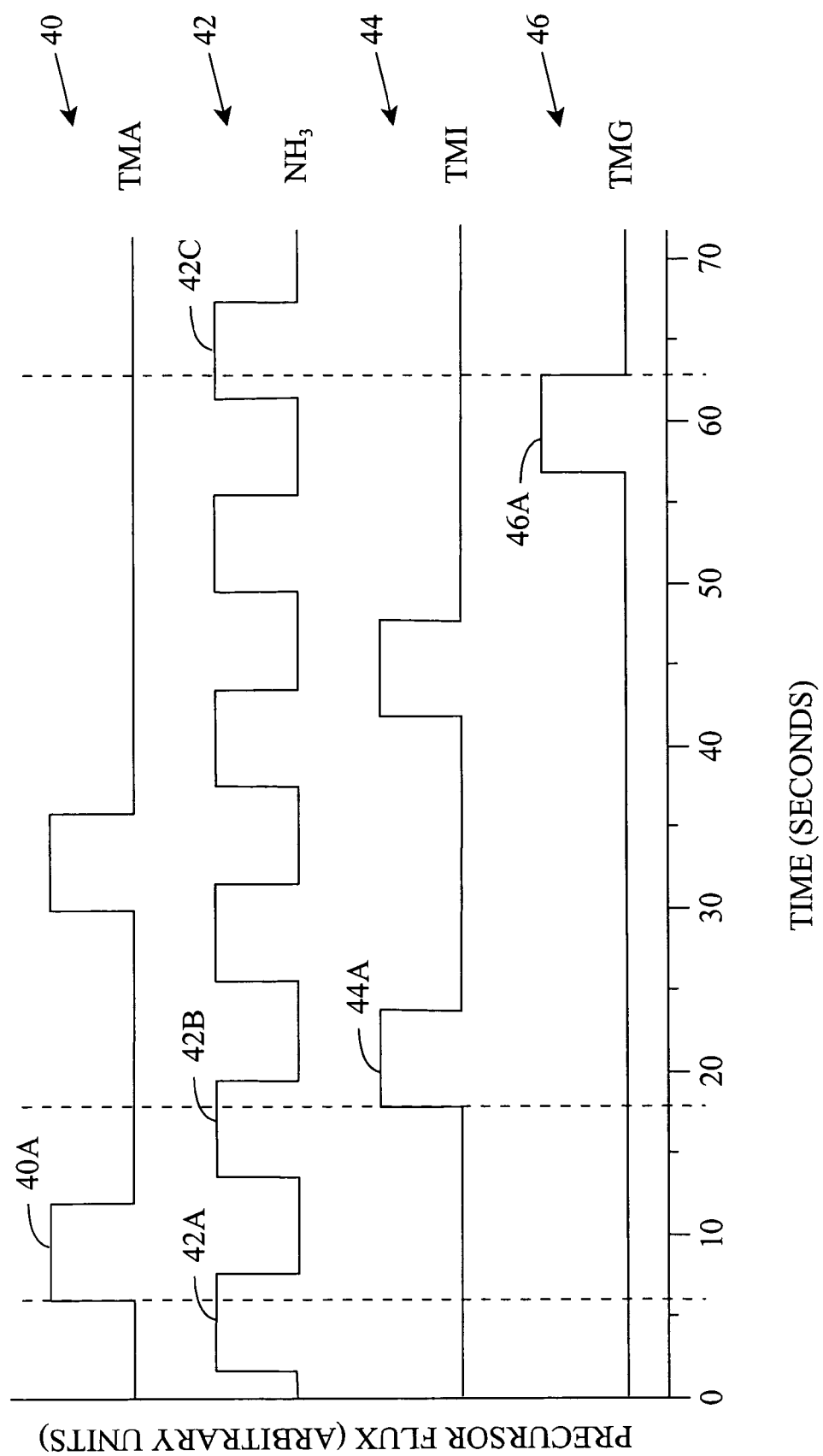
FIG. 3 is an illustrative sequence of flux pulses according to a second embodiment of the invention.

FIG. 3 shows several alternative series of pulses in which each series of pulses 40, 42, 44, 46 is used to apply a unique precursor flux onto a nitride-based film that is being grown. As in FIG. 3, a nitrogen precursor flux series of pulses 42 is pulsed every other time over the sequence. However, portions of the pulses for the remaining series of pulses 40, 44, 46 occur at the same time as one of the pulses in the nitrogen precursor flux series of pulses 42. For example, pulse 40A starts before pulse 42A ends, pulse 44A starts before pulse 42B ends, and pulse 46A continues through the start of pulse 42C. It is understood that numerous variations are possible. For example, two or more pulses can simultaneously start and/or finish, a pulse can start and finish during one or more other pulses, etc. Further, portions of a pulse can overlap the end of a previously started pulse and the start of a subsequently started pulse. Use of overlapping pulses provides additional ability to optimize the structure being grown and provides smoother transitions between stages than those provided by conventional MOCVD and PALE. For example, the overlapping pulses allow for a more gradual transition between the layers having different composition. In this case, the degree of the overlap can be used to control the sharpness of the transition.

Figure 4:
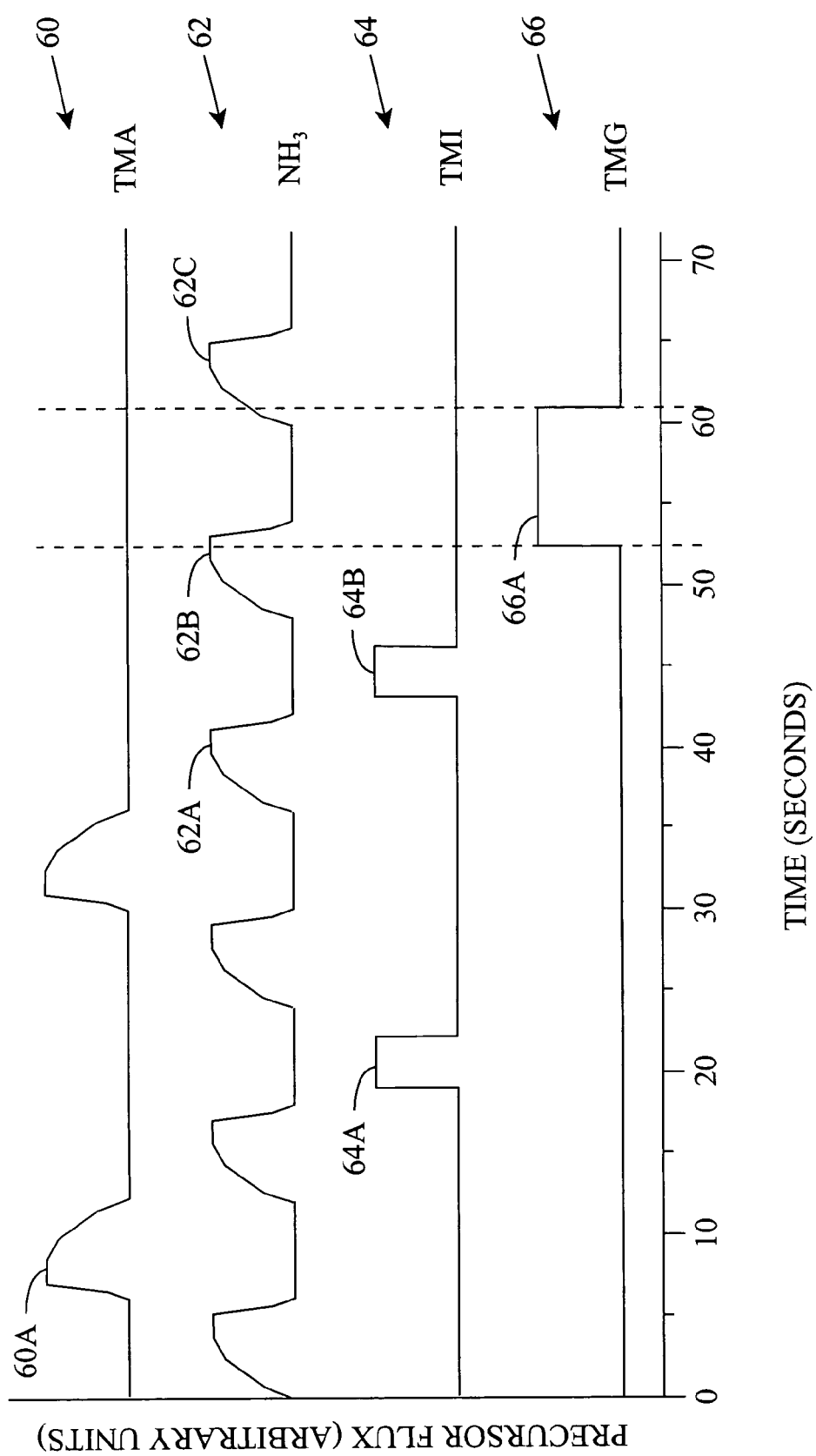
FIG. 4 is an illustrative sequence of flux pulses according to a third embodiment of the invention.

FIG. 4 shows another alternative embodiment of several series of pulses in which each series of pulses 60, 62, 64, 66 is used to apply a unique precursor flux onto a nitride-based film that is being grown. In this embodiment, the waveforms for each pulse 60A in series of pulses 60 is altered from the rectangular shape used in the previous embodiments. The modified waveform represents a flow rate for the particular precursor flux that varies during the pulse. In the related art, the precursor flux was either flowing at a constant rate or not flowing at all. Use of altered waveforms provides additional control over the migration of the precursor flux at the growth surface to help ensure a more uniform migration. Since the migration rate is a function of the surface coverage, the tailored waveforms allow for the migration rate to be optimized at all stages of the surface coverage. FIG. 4 also shows pulses 62A–C having a different non-rectangular waveform for optimizing the nitrogen precursor flux, pulses 64A having a shortened duration with a rectangular waveform, and pulse 66A having a longer duration that overlaps the end of pulse 62B and the start of pulse 62C.

It is understood that each of the series of pulses depicted in FIGS. 2–4 are only illustrative of the present invention. The invention is not limited to particular elements or types of precursor flux, a specific quantity of series of pulses, any duration, quantity, or pattern of pulses in each of the series of pulses, etc. Further, various features of each of the series of pulses can be combined to form a desired sequence of pulses for elements being deposited on a film. For example, pulse duration and shape can be modified for each pulse in a series of pulses based on the desired attributes of a structure.

The various sequences of pulses provide better incorporation of atoms into the growing crystal and improved surface coverage by providing better mobility of the precursor species on the growth surface. As a result, the epitaxial growth technology has been shown to scale up to approximately four inch structures and provide a large reduction of adverse aging effects. Further, the invention allows for sharp nitride-based film heterostructures, improved quality of quantum wells and barriers, better incorporation of In into AlGaN, and for the inclusion of thin (i.e., a few monolayers to a few nanometers) smoothing layers for strain control and a resulting reduction in growth defects. Still further, the invention allows a nitride-based film to be grown at lower temperatures. Because of the lower temperature, the nitride-based film can be grown over substrates comprising material such as lithium aluminate, lithium gallate, diamond, silicon, or the like that are unstable at the temperatures required using previous approaches. As will be recognized by one skilled in the art, products created using the present invention can be used in many types of semiconductor devices, including power switching devices, and light emitting devices.

For a comparison of growth techniques, a layer was grown using an existing technique and another layer was grown using one embodiment of the invention. In particular, both layers were grown on a 1.5 mm thick semi-insulating GaN layer. Using the conventional method, the GaN layer was deposited on a low temperature AlN buffer layer grown on a c-plane sapphire substrate. Subsequently, an InN layer was grown on the GaN layer using the conventional MOCVD method, and another InN layer was grown on the GaN layer using one embodiment of the invention. In the embodiment used, an InN epitaxial layer was grown at 550° C. with $N_2$ as a carrier gas. During the InN growth, the durations of alternating TMI pulses and $NH_3$ pulses were both set at six seconds. However, the alternating pulses overlapped for a period of two seconds, creating a repeating flow of In (four seconds), InN (two seconds), and N (four seconds). A total of six hundred pulses were used to grow the layer, which was approximately 0.3 mm thick. It is understood that correspondingly more/less pulses could be used for growing thicker/thinner layers.

Figure 5:
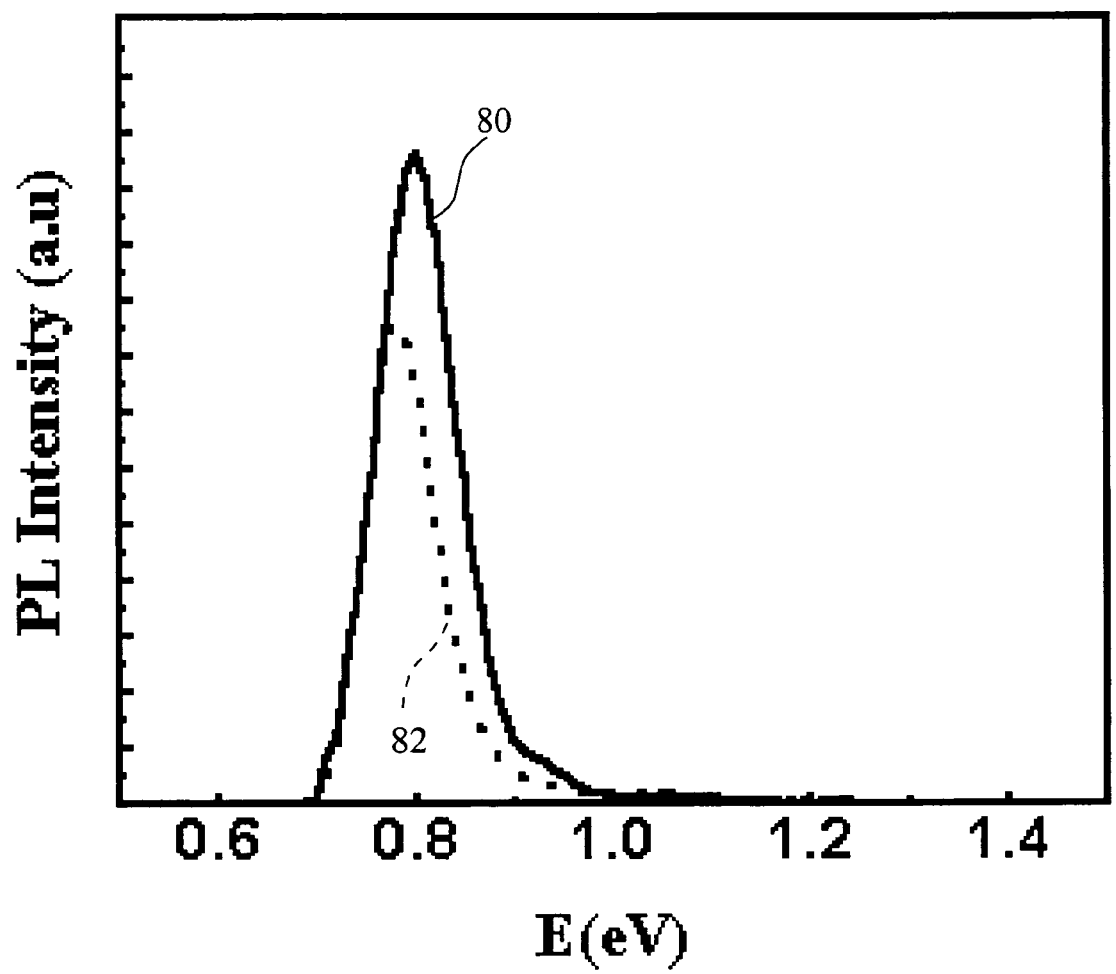
FIG. 5 shows normalized photoluminescence values for an InN layer grown using the conventional MOCVD technique and an InN layer grown using one embodiment of the invention.

FIG. 5 shows the results of a comparison of normalized photoluminescence (PL) values for the two layers. In particular, the PL intensity (arbitrary units) is plotted as a function of energy (eV) for the layer grown using the above-described embodiment of the invention and the layer grown using the conventional MOCVD method. As can be seen, the PL intensity 80 for the layer grown using the invention is considerably higher than the PL intensity 82 for the layer grown using the conventional MOCVD method. This shows that the growth technique of the invention can yield high quality layers.

Additional features can be incorporated along with the varied precursor flux pulses to further improve and/or control growth. For example, the nitride-based film can be illuminated with ultraviolet radiation. The illumination can occur during a particular pulse, between pulses, or both. Illumination of the growth surface with ultraviolet radiation can activate the precursor gases (if during a pulse) and/or activate a growth species at the growth surface (if between pulses). Further, one or more additional pulses can be incorporated during and/or between the various pulses. For example, a constant background precursor flux can be applied during the series of pulses. Additionally, doping pulses can be incorporated to modulate doping during the deposit of one or more layers. To this extent, dopants such as Si, Mg, Mn, C, or the like can be deposited using one or more pulses.

Other aspects of the growth environment can also be varied to improve and/or control growth. For example, a growth temperature can be varied to further improve and/or control growth. The growth temperature can be varied gradually or abruptly and/or during a single pulse or over several pulses. By varying the growth temperature, additional control over the quality of the material, composition and strain profile of the material, and/or growth and lateral overgrowth rates and conditions can be obtained. Similarly, the pressure can be varied during the deposition of one or more layers to provide an additional degree of control.

Figure 6:
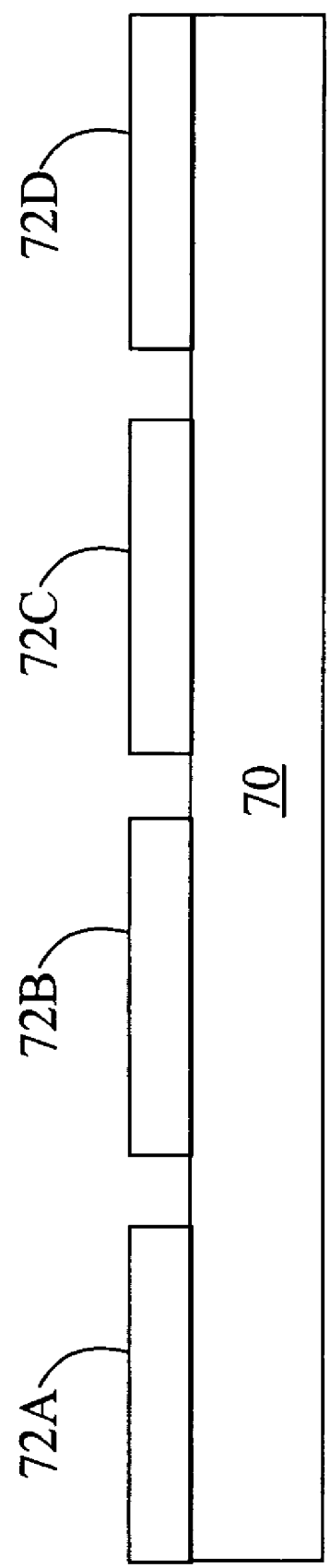
FIG. 6 shows an illustrative substrate with silicon dioxide stripes.

Various additional aspects can be incorporated into the substrate on which one or more layers are grown using the invention. For example, FIG. 6 shows a substrate 70 having a series of silicon dioxide stripes 72A–D deposited thereon. The invention can be used for lateral overgrowth epitaxy, in which one or more nitride-based films can be deposited over substrate 70 and/or silicon dioxide stripes 72A–D. It is understood, however, that any material and/or pattern (e.g., stripes, stars, etc.) can be deposited on substrate 70. Further, the invention can be used for the lateral air-bridged deposition of nitride-based films over various substrates, including a patterned substrate of wurtzite symmetry used for growth over a silicon substrate, a polar substrate having a wurtzite crystal symmetry and patterned with polar trenches (C-plane), a non-polar substrate patterned with trenches comprising sapphire, SiC, Si, bulk GaN, bulk AlN, bulk AlGaN, lithium aluminates, or the like.

The invention can be used in numerous applications. For example, lateral growth of a material such as GaN, AlN, InN, AlGaN, AlInGaN, or the like can also be performed using the invention in order to obtain an improved quality for the material over current solutions. For example, a template layer of the material that includes one or more "holes" can be deposited over a substrate comprised of sapphire, SiC, Si, diamond, or the like, using a wet etch to decorate defects concentrated near threading dislocations. The invention can then be used for lateral overgrowth of the holes in the template layer.

Further, a plurality of low-temperature (low-T) islands/nucleation centers comprising the material can be deposited on SiC substrates or the like. The invention can then be used in the lateral growth of a high-temperature (high-T) layer of the material. In this case, the low-T islands can act as a selective area deposited material without the use of a masking layer. By appropriately configuring a time interval between, for example, a Ga and ammonia pulse and an Al and ammonia pulse during growth of AlGaN, separation due to varying Ga and Al surface mobility should be minimized and/or prevented.

Various other applications are also possible. For example, the invention can be used to grow anisotropic conductivity structures or the like. Additionally, a doping superlattice can be grown using the invention to control strain in a device. Still further, doping control and/or spatial in-plane composition can be performed by non-uniform species migration and/or non-uniform precursor flows. The invention can also be used to perform co-doping by native species.

The foregoing description of various embodiments of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method of growing a nitride-based film, the method comprising:
    applying a first precursor flux for a first element using a first series of pulses, wherein a pulse in the first series of pulses lasts for an approximate first duration and wherein the first element comprises nitrogen; and
    applying a second precursor flux for a second element using a second pulse, wherein the second pulse has a second duration that is not equal to the first duration, and wherein at least a portion of a pulse in the first series of pulses is applied at the same time that at least a portion of the second pulse is applied.
2. The method of claim 1, further comprising applying a third precursor flux for a third element using a third pulse, wherein the third pulse has a third duration, and wherein the third duration is not equal to the first duration.

3. The method of claim 2, further comprising applying a fourth precursor flux for a fourth element using a fourth pulse, wherein the fourth pulse has the first duration.

4. The method of claim 3, wherein the nitrogen precursor flux comprises NH3, the second precursor flux comprises TMG, the third precursor flux comprises TMI, and the fourth precursor flux comprises TMA.

5. The method of claim 1, wherein at least one of a pulse in the first series of pulses and the second pulse has a non-rectangular waveform.

6. The method of claim 1, further comprising illuminating the nitride-based film with ultraviolet radiation.

7. The method of claim 1, wherein the nitride-based film is grown on a substrate comprising at least one of: lithium aluminate and silicon.

8. The method of claim 1, wherein a pulse in the first series of pulses is separated from an adjacent pulse by a gap having the first duration.

9. The method of claim 1, wherein the applying the first and second precursor fluxes provide sequential flows that include:
- a first flow including the first precursor flux but not the second precursor flux;
- a second flow including both the first and second precursor fluxes; and
- a third flow including the second precursor flux but not the first precursor flux.

* * * * *